United States Patent [19]
Yasaka et al.

[11] Patent Number: 6,150,023
[45] Date of Patent: Nov. 21, 2000

[54] DUMMY WAFER

[75] Inventors: Tatsuhiro Yasaka; Takashi Nishizawa; Kazuo Muramatsu; Tsutomu Watanabe, all of Kobe, Japan

[73] Assignee: Kabushiki Kaisha Kobe Seiko Sho, Kobe, Japan

[21] Appl. No.: 08/637,496

[22] Filed: Apr. 25, 1996

[30] Foreign Application Priority Data

May 19, 1995 [JP] Japan ................................. 7-121367

[51] Int. Cl.$^7$ ........................................................ B32B 9/00
[52] U.S. Cl. .......................... 428/408; 428/212; 428/688; 428/689; 428/698
[58] Field of Search ..................... 428/408, 688, 428/689, 698, 212; 59/293

[56] References Cited

U.S. PATENT DOCUMENTS

| | | | |
|---|---|---|---|
| 4,856,887 | 8/1989 | Wakugawa | 428/408 |
| 5,149,338 | 9/1992 | Fulton | 51/293 |

FOREIGN PATENT DOCUMENTS 0 663 687   7/1995   European Pat. Off. .

OTHER PUBLICATIONS

Webster's II, New Riverside University Dictionary, p. 533, 1995.
CRC 64$^{th}$ Ed, 1983–84 p. D–39.

Patent Abstracts of Japan, vol. 018, No. 626 (E–1636), Nov. 29, 1994 & JP 06 244142 A (Sumitomo Electric Ind Ltd), Sep. 2, 1994 *Abstract*.

Patent Abstracts of Japan vol. 096, No. 001, Jan. 31, 1996 & JP 07 240401 A (Nisshinbo Ind Inc), Sep. 12, 1995 *Abstract*.

*Primary Examiner*—William Krynski
*Attorney, Agent, or Firm*—Oblon, Spivak, McClelland, Maier & Neustadt, P.C.

[57] ABSTRACT

The present invention provides a test dummy wafer used in the process for manufacturing a semiconductor device, which has more excellent etching resistance than a silicon wafer, and excellent mirror surface properties and evenness required for a substrate, and which causes no contamination source in the manufacturing process. The dummy wafer is composed of glassy carbon, and at least one side thereof is preferably polished to a mirror surface having a surface roughness Ra of not more than 0.005 $\mu$m. The dummy wafer of the present invention has excellent characteristics as a dummy wafer for monitoring the thickness of a CVD film. The dummy wafer having specific electric resistance of not more than 0.1 $\Omega\cdot$cm exhibits excellent characteristics as a dummy wafer for monitoring the thickness of a film formed by sputtering and confirming cleanliness.

6 Claims, No Drawings

DUMMY WAFER

BACKGROUND OF THE INVENTION

1. Field of the Invention

The present invention relates to a dummy wafer used in the process for manufacturing semiconductor devices such as a semiconductor memory and a semiconductor integrated circuit.

2. Description of the Related Art

In manufacturing a semiconductor device, a silicon wafer polished to a mirror surface is used as a substrate, and a polysilicon or $Si_3N_4$ film is formed on the substrate by CVD or a W thin film is formed on the substrate by sputtering according to the type of the intended semiconductor device.

Quality requirements keep becoming restrict, and very high levels of processing accuracy and cleanliness are required as the performance and integration density of a semiconductor device are increased. Therefore, in the line for manufacturing a semiconductor device, a silicon wafer which is polished to a mirror surface in the same manner as the product is used as a test wafer (referred to as a "idummy wafer" hereinafter) for checking various inspection items so that each processing is performed while confirming processing accuracy and cleanliness in each process. Examples of such a dummy wafer include a dummy wafer used for monitoring the film thickness after film formation, a dummy wafer for checking cleanliness in each process by counting particles which adhere to a wafer, and the like.

Since the line for manufacturing a semiconductor device generally comprises at least 100 processes, many dummy wafers are required. A silicon wafer is expensive and is thus desired to be repeatedly used as the dummy wafer as many times as possible. For example, the dummy wafer used for monitoring the film thickness is reused after the thin film formed thereon is removed by etching. However, the etched silicon wafer has poor surface properties, and must be thus polished to a mirror surface again. In addition, since the properties of the silicon wafer itself depend upon the material used for film formation, it is necessary to remove the deteriorated layer by etching. In such a case, even if a mirror surface is obtained by re-polishing the silicon wafer after the etching, since the thickness of the wafer is gradually decreased, the number of times of repeated use is limited.

Examination is thus made on a substitute which exhibits the same characteristics as those of the silicon wafer and excellent etching resistance when used as the dummy wafer.

Examples of substitutes for t he silicon wafer include dummy wafers comprising ceramic substrates of SiC, $Si_3N_4$ and the like, which are polished to a mirror surface. However, such dummy wafers are inferior to the silicon wafer from the viewpoints of mirror surface properties and evenness, and has the problem of producing dust particles in the manufacturing process and thus causing a contamination source of a semiconductor device.

SUMMARY OF THE INVENTION

The present invention has been achieved in consideration of the above-described situation, and an object of the present invention is to provide a dummy wafer which has more excellent etching resistance than a silicon wafer and excellent mirror surface properties and evenness required for a substrate, and which causes no contamination source in the manufacturing process.

In order to achieve the object of the present invention, there is provided a test dummy wafer used in the process for manufacturing a semiconductor device, comprising glassy carbon, wherein at least one side thereof is preferably polished to a mirror surface having a surface roughness Ra of not more than 0.005 $\mu$m.

The dummy wafer according to the present invention has excellent characteristics for monitoring the thickness of a film formed by CVD. However, the dummy wafer having a specific electric resistance of not less than 0.1 $\Omega \cdot$cm exhibits excellent characteristics as a dummy wafer for monitoring the thickness of a film formed by sputtering and confirming cleanliness.

When the dummy wafer is subjected to hot isostatic pressing, a high-density product is obtained. When the product is polished to a mirror surface, a dummy wafer having more excellent mirror surface properties and etching resistance is obtained.

As a result of intensive research for finding a material which can be substituted for the silicon wafer used as a test dummy wafer in the process for manufacturing a semiconductor device, and which exhibits excellent etching resistance, the inventors found that the object of the present invention can be achieved by using glassy carbon.

Although a conventional ceramic substrate has the problem with respect to poor mirror surface properties and evenness, and the problem of causing a contamination source due to the particles generated in the manufacturing process, a dummy wafer comprising glassy carbon is capable of removing all of these problems. The dummy wafer of the present invention has (1) excellent mirror surface properties and (2) evenness, and (3) causes no contamination source due to the particles generated in the manufacturing process, as described below.

(1) A conventional ceramic dummy wafer comprises a polycrystal, and thus grain boundaries appear on the surface by mirror polishing, thereby obtaining surface roughness Ra of 0.008 $\mu$m at best. On the other hand, the dummy wafer of the present invention comprises amorphous glassy carbon, and thus no grain boundary appears by mirror polishing, thereby obtaining excellent mirror surface having roughness Ra of not more than 0.005 $\mu$m.

(2) With respect to evenness, the conventional ceramic dummy wafer exhibits an amount of warping of about 200 $\mu$m in the outside dimension and is thus unsatisfactory, but the dummy wafer of the present invention exhibits an amount of warping of about 50 $\mu$m which is the same level as the silicon wafer.

(3) In some manufacturing processes, the conventional ceramic dummy wafer produces dust particles by plasma irradiation, and thus causes a contamination source of a semiconductor device. Although the dummy wafer of the present invention also produces fine particles by plasma irradiation, the fine particles are carbon particles and are thus easily be gasified in a plasma atmosphere, thereby causing n o contamination source of the semiconductor device.

The dummy wafer comprising glassy carbon in which at least one side thereof is polished to a mirror surface having a surface roughness Ra of not more than 0.005 $\mu$m can be used as the dummy wafer for monitoring the thickness of a film formed by CVD using $Si_3N_4$ or polysilicon. Even when the thin film of $Si_3N_4$ or polysilicon is removed by etching for reusing the dummy wafer, the dummy wafer does not so deteriorate in surface roughness after etching as the silicon wafer does, and thus has excellent etching resistance.

The inventors also found that the specific electric resistance of glassy carbon can be controlled so that the dummy wafer comprising glassy carbon can also be used as a dummy wafer other than the dummy wafer for monitoring the thickness of the film formed by CVD using $Si_3N_4$ or polysilicon. Specifically, the specific electric resistance can be controlled to at least 0.1 $\Omega \cdot$cm so that the dummy wafer can be substituted for a dummy wafer for monitoring the thickness of the film formed by sputtering. The dummy wafer can also be used as a particle counting dummy wafer for checking cleanliness in each step by counting the particles which adhere to the dummy wafer.

The method of producing the dummy wafer of the present invention is not limited, and the dummy wafer may be produced by forming a molded product of a thermocurable resin powder by a known method, burning the produced in an inert gas, and then polishing at least one side of the product to a mirror surface having a surface roughness Ra of not more than 0.005 μm. The specific electric resistance of the dummy wafer may be controlled by controlling the rate of temperature increase, the burning temperature, the burning time, etc. For example, the specific electric resistance can be increased by setting the burning temperature to a low level.

When the dummy wafer is subjected to hot isostatic pressing after burning and then polished to a mirror surface, high-density glassy carbon can be obtained, and the resultant dummy wafer has excellent surface properties having surface roughness, which is deceased by mirror polishing, and more excellent etching resistance.

The present invention is not limited to the composition comprising glassy carbon, usual thermocurable resins can be used as the material. Examples of known resin materials which can be used include phenolic resins, epoxy resins, polyester resins, furan resins, urea resins, melamine resins, alkyd resins, xylene resins and the like.

DETAILED DESCRIPTION OF THE PREFERRED EMBODIMENTS

Although the present invention is described with reference to examples, the present invention is not limited to these examples, and appropriate modification can be made within the technical scope of the present invention according to the gist described above and below.

EXAMPLE 1

Three dummy wafers of This invention examples 1 to 3 below were prepared.

(This invention example 1)

Phenol formaldehyde resin powder having a particle size of 100 to 200 μm was dried at a temperature of 100° C. for 24 hours, supplied to a raw material feeder of an injection molding machine, and then molded in a disk form having an outer diameter Ø of 150 mm and a thickness of 1.5 mm after being held for 1 minute at a molding temperature of 160° C. and a molding pressure of 200 kg/cm². A spool of the molded product was removed, and burrs were removed from the edge of the product. The molded product was then held in a hot press kept at 120° C. and a pressure of 100 kg/cm² for 2 minutes to remove distortion of the molded product.

The molded product was held by a high-purity graphite jig and carbonized under the conditions below. Namely, the molded product was burnt in an atmosphere of nitrogen gas at a flow rate of 100 ml/min at rates of temperature increase of 10±3° C./hr, 15±3° C./hr and 20±3° C./hr within the temperature ranges of 120 to 450° C., 450 to 850° C. and 850 to 1450° C., respectively. The product was then maintained at the highest attained temperature for 5 hours and then cooled at a rate of 25° C./hr within the temperature range to 850° C. and in a furnace within the temperature range below 850° C. during the step of temperature decrease.

After burning, the substrate was processed to an outer diameter of 100±0.5 mm by a grinding machine having two axes including the axis of a grinding stone having an electrodeposited diamond grinding stone mounted at the tip thereof, and the substrate axis for fixing and rotating the substrate to be processed. The electrodeposited diamond grinding stone is No. #600, and the surface roughness of the end surface after processing was Rmax 0.2 μm.

The substrate was then polished by using a double-side polishing machine (Speed Fam Corp., 16B) having grooved cast-iron surface plates mounted on both sides thereof to produce a dummy wafer. The polishing process comprises three steps of rough polishing, intermediate polishing and finish polishing using abrasive alumina grains Nos. #800, #4000 and #10000, respectively.

After polishing, the surface roughness Ra was 0.003 μm, the specific electric resistance was $4 \times 10^{-3}$ Ω·cm, and the thermal expansion coefficient of $4 \times 10^{-6}$/° C.

(This invention example 2)

A dummy wafer of This invention example 2 was produced by the same method as in This invention example 1 except that the highest attained temperature during burning was 850° C.

After polishing, the surface roughness Ra was 0.004 μm, the specific electric resistance was 0.12 Ω·cm, and the thermal expansion coefficient of $6 \times 10^{-6}$/°C.

(This invention example 3)

A dummy wafer of This invention example 3 was produced by the same method as in This invention example 1 except that the highest attained temperature during burning was 1550° C., that the rate of temperature increase within the temperature range of 850 to 1550° C. was 20±3° C./hr, and that hot isostatic pressing (HIP treatment) was performed at 2600° C., 200 atm for a holding time of 5 hr before polishing of both sides.

After polishing, the surface roughness Ra was 0.001 μm, the specific electric resistance was $3 \times 10^{-3}$ Ω·cm, and the thermal expansion coefficient of $3 \times 10^{-6}$/°C.

The dummy wafers of This invention examples 1 to 3 and a silicon wafer were then used for monitoring the thickness of a film thickness in the CVD film formation process, and the characteristics of these dummy wafers were examined.

A $Si_3N_4$ film was formed on each of the four dummy wafers by low pressure CVD under the same conditions, and the thickness of the film was measured. Then, the obtained $Si_3N_4$ film was removed by etching with $H_3PO_4$ at 150° C., and the surface roughness Ra of each dummy wafer was measured.

A polysilicon film was formed on each of the four dummy wafers by the same method as described above, and the thickness of the film was measured. The obtained polysilicon film was removed by etching with hydrofluoric acid/nitric acid at room temperature, and then the surface roughness Ra of each dummy wafer was measured.

The results obtained are shown in Table 1.

TABLE 1

| | Thickness of CVD film (μm) | | Surface roughness Ra (μm) | | |
|---|---|---|---|---|---|
| | | | A | B | |
| Type of dummy wafer | $Si_3N_4$ | Polysilicon | | $Si_3N_4$ | Polysilicon |
| Glassy carbon This invention example | | | | | |
| 1 | 0.232 | 0.231 | 0.002 | 0.004 | 0.006 |
| 2 | 0.210 | 0.222 | 0.003 | 0.005 | 0.008 |
| 3 | 0.198 | 0.275 | 0.001 | 0.001 | 0.003 |
| Silicon wafer | 0.215 | 0.232 | 0.002 | 0.010 | 0.015 |

A: Before film formation
B: After etching
*All values are averages of ten samples.

The results shown in Table 1 reveal that all dummy wafers of This invention examples 1 to 3 have thicknesses equivalent to that of the silicon wafer (allowable error range ±0.005

μm), and can thus be substituted for a silicon wafer for monitoring the thickness of a film in the CVD film formation process.

The results of surface roughness after etching indicate that although the silicon wafer having surface roughness Ra of 0.002 μm exhibits Ra of 0.010 μm or more after etching, all dummy wafers of This invention examples 1 to 3 exhibit Ra of less than 0.010 μm after etching and are thus excellent in etching resistance. Particularly, This invention example 3 subjected to HIP processing has excellent mirror surface properties before film formation and excellent etching resistance.

EXAMPLE 2

A W film was formed on each of the dummy wafers of This invention examples 1 to 3 and the silicon wafer by sputtering, and the thickness of the film was measured. The obtained W thin film was removed by etching with an aqueous hydrogen peroxide solution at 50° C., and the surface roughness Ra of each dummy wafer was then measured. The results obtained are shown in Table 2.

TABLE 2

| | Specific electric resistance | W film thickness | Surface roughness Ra (μm) | | Number of particles |
|---|---|---|---|---|---|
| | (Ω·cm) | (μm) | A | B | counted |
| This invention example 1 | 0.004 | 0.750 | 0.002 | 0.004 | 5.3 |
| This invention example 2 | 0.12 | 0.651 | 0.003 | 0.005 | 11.2 |
| This invention example 3 | 0.003 | 0.610 | 0.001 | 0.001 | 2.3 |
| Silicon wafer | 5.0 | 0.662 | 0.002 | 0.010 | 10.6 |

A: Before film formation
B: After etching
*All values are averages of ten samples.

The dummy wafers of This invention examples 1 and 3 have low values of specific electric resistance, and cause the formation of a thick W film beyond the allowable error range (±05 μm). However, the dummy wafer of This invention example 2 causes the formation of a W film having substantially the same thickness as the silicon wafer and has a specific electric resistance of 0.1 Ω·cm or more. It is thus found that the dummy wafer of This invention example 2 can also be used for monitoring the thickness of a sputtered film.

All dummy wafers of This invention examples 1 to 3 have excellent etching resistance, as in Example 1. Particularly, This invention example 3 subjected to HIP processing is excellent in etching resistance.

EXAMPLE 3

In order to examine characteristics as a dummy wafer for confirming cleanliness, the four dummy wafers were passed through the cleaning step after the photolithographic step for forming a semiconductor device circuit, and the number of particles which adhered to the surfaces was measured. The particles per 25 $cm^2$ were counted by a differential interference microscope. The results obtained are shown in Table 2.

Although the average number of particles of the silicon wafer is 10.6, the numbers of particles of This invention examples 1 and 3 are not more than a half of this value and are excessively small. However, the dummy wafer of This invention example 2 shows substantially the same number of the particles counted as the silicon wafer. It is thus found that the dummy wafer of the present invention having specific electric resistance of 0.1 Ω·cm or more can also be used as a dummy wafer for confirming cleanliness.

The present invention having the above construction can provide a dummy wafer which is more excellent in etching resistance than a silicon wafer, and excellent in mirror surface properties and evenness required for a substrate, and which causes no contamination source in the production process.

What is claimed is:

1. A dummy wafer used as a test dummy wafer in a process for manufacturing a semiconductor device, comprising glassy carbon.

2. A dummy wafer according to claim 1, wherein at least one side is polished to a mirror surface having surface roughness Ra of 0.005 μm or less.

3. A dummy wafer according to claim 1 or 2, wherein specific electric resistance is 0.1 Ω·cm or more.

4. A dummy wafer according to claim 1, wherein the dummy wafer has been prepared by a process including a step of subjecting the wafer to hot isostatic pressing.

5. A dummy wafer according to claim 2, wherein the dummy wafer has been prepared by a process including a step of subjecting the wafer to hot isostatic pressing.

6. A dummy wafer according to claim 3, wherein the dummy wafer has been prepared by a process including a step of subjecting the wafer to hot isostatic pressing.

\* \* \* \* \*